United States Patent
Hao et al.

(10) Patent No.: US 10,402,004 B2
(45) Date of Patent: Sep. 3, 2019

(54) TOUCH CONTROL DRIVING UNIT, DRIVING METHOD THEREOF AND TOUCH CONTROL DRIVING CIRCUIT

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Xueguang Hao, Beijing (CN); Cheng Li, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 49 days.

(21) Appl. No.: 15/122,328

(22) PCT Filed: May 18, 2015

(86) PCT No.: PCT/CN2015/079166
§ 371 (c)(1),
(2) Date: Aug. 29, 2016

(87) PCT Pub. No.: WO2016/119340
PCT Pub. Date: Aug. 4, 2016

(65) Prior Publication Data
US 2016/0370928 A1 Dec. 22, 2016

(30) Foreign Application Priority Data

Jan. 26, 2015 (CN) .......................... 2015 1 0038756

(51) Int. Cl.
*G06F 3/041* (2006.01)
*G06F 3/044* (2006.01)
*G11C 19/28* (2006.01)

(52) U.S. Cl.
CPC ............ *G06F 3/0416* (2013.01); *G06F 3/044* (2013.01); *G11C 19/28* (2013.01)

(58) Field of Classification Search
CPC ........ G11C 19/28; G06F 3/044; G06F 3/0416
See application file for complete search history.

(56) References Cited

U.S. PATENT DOCUMENTS

| 2010/0214261 | A1 | 8/2010 | Yamanaka et al. |
| 2016/0188049 | A1* | 6/2016 | Yang ....................... G06F 3/044 345/174 |
| 2016/0188091 | A1* | 6/2016 | Sun ....................... G06F 3/0416 345/174 |

FOREIGN PATENT DOCUMENTS

| CN | 101957507 A | 1/2011 |
| CN | 203070250 U | 7/2013 |

(Continued)

OTHER PUBLICATIONS

First Office Action dated Jan. 24, 2017 in corresponding Chinese Application No. 201510038756.X.

(Continued)

*Primary Examiner* — Abhishek Sarma
(74) *Attorney, Agent, or Firm* — Nath, Goldberg & Meyer; Joshua B. Goldberg (57) ABSTRACT

A touch control driving unit includes a shift register module, a strobe module and an output module, wherein the shift register module includes a first control port, an incoming port and a triggering signal outgoing port, is connected to the strobe module, and is configured to generate a triggering signal; the strobe module includes a second control port and a strobe signal port, is connected to the shift register module, and is configured to control the output module; and the output module includes an outgoing port, a stable level port (Continued)

and a touch control signal port, and is configured to output a stable level or a touch control signal under control of the strobe module.

17 Claims, 3 Drawing Sheets

(56) References Cited

FOREIGN PATENT DOCUMENTS

| | | |
|---|---|---|
| CN | 103294252 A | 9/2013 |
| CN | 103823589 A | 5/2014 |
| CN | 104103253 A | 10/2014 |
| CN | 104238850 | 12/2014 |
| CN | 104282282 A | 1/2015 |
| CN | 104503652 A | 4/2015 |
| KR | 10-2014-0095734 A | 8/2014 |

OTHER PUBLICATIONS

International Search Report dated Oct. 29, 2015 issued in International Application No. PCT/CN2015/079166 along with an English translation of the Written Opinion of the International Searching Authority.

* cited by examiner

TOUCH CONTROL DRIVING UNIT, DRIVING METHOD THEREOF AND TOUCH CONTROL DRIVING CIRCUIT

This is a National Phase Application filed under 35 U.S.C. 371 as a national stage of PCT/CN2015/079166 filed on May 18, 2015, an application claiming the benefit of Chinese application No. 201510038756.X filed on Jan. 26, 2015, the content of each of which is hereby incorporated by reference in its entirety.

TECHNICAL FIELD

The present invention relates to the field of touch control driving technology, and in particular to a touch control driving unit, a driving method thereof and a touch control driving circuit.

BACKGROUND

A mutual capacitance touch control structure mainly includes a plurality of scanning electrodes (Txs) and a plurality of sensing electrodes (Rxs) crossing the plurality of scanning electrodes. A touch control signal (e.g., a high frequency alternating signal) is inputted to the scanning electrodes alternately to cause the corresponding sensing electrode to generate an induced signal. When a touch occurs, a capacitance between the scanning electrode and the sensing electrode at the touch point changes, the induced signal in the sensing electrode also changes, and the touch position can be obtained by analyzing the induced signal.

During a touch control process, it is necessary to input a touch control signal to the scanning electrodes alternately, and the scanning electrodes are maintained at a stable level when a touch control signal is not inputted thereto. The stable level may be a common voltage, that is, the scanning electrodes may also sever as common electrodes. If a driving chip is to be used for inputting the touch control signal to each of the scanning electrodes, the driving chip will have a complicated structure. For this purpose, an existing solution is to provide a touch control driving circuit on a substrate, and the touch control driving circuit includes a plurality of cascaded touch control driving units. Each of the touch control driving units is used for supplying a touch control signal to one scanning electrode, and supplying a triggering signal to the next stage touch control driving unit such that the next stage touch control driving unit start to operate. In this way, all of the scanning electrodes can be driven with a few signals.

However, an existing touch control driving circuit has disadvantages of complicated structure, large area (which disables a narrow-frame design), unstable output, big noise, and the like.

SUMMARY

In view of the disadvantages of complicated structure, large area, unstable output, big noise, and the like of an existing touch control driving circuit, the present invention provides a touch control driving unit, a driving method thereof and a touch control driving circuit, wherein the touch control driving unit and the touch control driving circuit each have a simple structure, a small area, a stable output, and low noise.

An embodiment of the present invention provides a touch control driving unit, which includes a shift register module, a strobe module and an output module. The shift register module includes a first control port, an incoming port and a triggering signal outgoing port, is connected to the strobe module, and is configured to generate a triggering signal. The strobe module includes a second control port and a strobe signal port, is connected to the shift register module, and is configured to control the output module. The output module includes an outgoing port, a stable level port and a touch control signal port, and is configured to output a stable level or a touch control signal under control of the strobe module.

The touch control driving unit may further include an amplifying module that is provided between the strobe module and the output module, and that is configured to amplify a signal generated by the strobe module and used for controlling the output module.

The shift register module may further include a first NOT gate, a second NOT gate, a first transistor, a first tri-state NOT gate and a second tri-state NOT gate. The first transistor is an N-type transistor, a first electrode of the first transistor is connected to the first control port, a second electrode of the first transistor is connected to a low level signal, and a gate electrode of the first transistor is connected to an output terminal of the first NOT gate. An input terminal of the first NOT gate is connected to the first control port. An input terminal of the first tri-state NOT gate is connected to the incoming port, a low level turn-on terminal of the first tri-state NOT gate is connected to the output terminal of the first NOT gate, a high level turn-on terminal of the first tri-state NOT gate is connected to the first control port, and an output terminal of the first tri-state NOT gate is connected to an input terminal of the second NOT gate and an output terminal of the second tri-state NOT gate. An input terminal of the second tri-state NOT gate is connected to the triggering signal outgoing port, an output terminal of the second NOT gate and the strobe module, a low level turn-on terminal of the second tri-state NOT gate is connected to the first control port, and a high level turn-on terminal of the second tri-state NOT gate is connected to the output terminal of the first NOT gate.

The strobe module may further include a NAND gate, a second transistor, a third transistor, a third NOT gate and a first transmission gate. The second transistor is an N-type transistor, a first electrode of the second transistor is connected to the second control port, a second electrode of the second transistor is connected to the low level signal, and a gate electrode of the second transistor is connected to an output terminal of the NAND gate, an input terminal of the third NOT gate and a low level turn-on terminal of the first transmission gate. A first input terminal of the NAND gate is connected to the second control port, a second input terminal of the NAND gate is connected to the input terminal of the second tri-state NOT gate of the shift register module. An output terminal of the third NOT gate is connected to a gate electrode of the third transistor and a high level turn-on terminal of the first transmission gate. The third transistor is a P-type transistor, a first electrode of the third transistor is connected to the amplifying module and an output terminal of the first transmission gate, and a second electrode of the third transistor is connected to the low level signal. An input terminal of the first transmission gate is connected to the strobe signal port.

The amplifying module may include an even number of NOT gates connected in series, among the even number of NOT gates connected in series, an output terminal of a previous stage NOT gate is connected to an input terminal of a next stage NOT gate adjacent to the previous stage NOT gate. An input terminal of the first NOT gate of the even number of NOT gates connected in series is connected to the first electrode of the third transistor of the strobe module, and both an input terminal and an output terminal of the last NOT gate of the even number of NOT gates connected in series are connected to the output module.

The number of NOT gates connected in series in the amplifying module may be 4.

The output module may further include a second transmission gate and a third transmission gate. An input terminal of the second transmission gate is connected to the touch control signal port, an output terminal of the second transmission gate is connected to the outgoing port, a high level turn-on terminal of the second transmission gate is connected to an output terminal of the last NOT gate of the amplifying module, and a low level turn-on terminal of the second transmission gate is connected to an input terminal of the last NOT gate of the amplifying module. An input terminal of the third transmission gate is connected to the stable level port, an output terminal of the third transmission gate is connected to the outgoing port, a high level turn-on terminal of the third transmission gate is connected to the input terminal of the last NOT gate of the amplifying module, and a low level turn-on terminal of the third transmission gate is connected to the output terminal of the last NOT gate of the amplifying module.

The stable level port may be a common voltage port.

Another embodiment of the present invention provides a driving method of the touch control driving unit as described above, the driving method including: a triggering stage of outputting a triggering signal through the triggering signal outgoing port, and outputting a stable level to the outgoing port; a touch control stage of outputting a triggering signal through the triggering signal outgoing port, and outputting a touch control signal to the outgoing port; a recovery stage of outputting a triggering signal through the triggering signal outgoing port, and outputting a stable level to the outgoing port; and a cycle stage of outputting a low level through the triggering signal outgoing port, and outputting a stable level to the outgoing port continuously.

The driving method of the touch control driving unit may include: the triggering stage of inputting a high level to the incoming port, inputting a high level to the first control port, inputting a low level to the second control port, and inputting a low level to the strobe signal port; the touch control stage of inputting a low level to the first control port, inputting a high level to the second control port, and inputting a high level to the strobe signal port; the recovery stage of inputting a low level to the first control port, inputting a high level to the second control port, and inputting a low level to the strobe signal port; and the cycle stage of performing a first sub-cycle stage and a second sub-cycle stage alternately, wherein, in the first sub-cycle stage, a low level is inputted to the incoming port, a high level is inputted to the first control port, and a low level is inputted to the second control port, and in the second sub-cycle stage, a low level is inputted to the first control port, and a high level is inputted to the second control port.

Still another embodiment of the present invention provides a touch control driving circuit, which includes a plurality of the above-described touch control driving units which are cascaded, wherein, an outgoing port of each stage of touch control driving unit is connected to one scanning electrode, and a triggering signal outgoing port of the stage of touch control driving unit is connected to an incoming port of a next stage of touch control driving unit which is adjacent to the stage of touch control driving unit.

Of any two adjacent touch control driving units, a first control port of one touch control driving unit may be configured to receive a first clock signal, a second control port of the one touch control driving unit may be configured to receive a second clock signal, a first control port of the other touch control driving unit may be configured to receive the second clock signal, and a second control port of the other touch control driving unit may be configured to receive the first clock signal.

Level states of the first and second clock signals may be opposite to each other.

The so-called "NOT gate," "NAND gate," "transmission gate" and "tri-state NOT gate" in the present invention are all logic circuits.

Specifically, a NOT gate can perform a "NOT" operation on an input, that is, the output thereof will be a low level if the input is a high level, while the output thereof will be a high level if the input is a low level. Generally, a NOT gate needs to be connected to a high level signal and a low level signal to operate normally.

A NAND gate performs an "AND" operation on two inputs first, and then performs a "NOT" operation on a result of the "AND" operation. Thus, the NAND gate outputs a low level only if the two inputs are all high levels, otherwise, the NAND gate will always output a high level. Generally, a NAND gate needs to be connected to a high level signal and a low level signal to operate normally.

A transmission gate functions like a switch, and can be turned on or off depending on signals at its control terminals. A transmission gate has two control terminals which are a high level turn-on terminal and a low level turn-on terminal. A transmission gate will be turned on only if its low level turn-on terminal is at a low level and its high level turn-on terminal is at a high level, otherwise, the transmission gate will be turned off.

A tri-state NOT gate has a turned-off state and a turned-on state. When being in the turned-on state, a tri-state NOT gate will perform a "NOT" operation on a signal at its input terminal, and correspond to a combination of a transmission gate with a NOT gate. A tri-state NOT gate has two control terminals which are a high level turn-on terminal and a low level turn-on terminal. A tri-state NOT gate will be turned on only if its low level turn-on terminal is at a low level and its high level turn-on terminal is at a high level, otherwise, the tri-state NOT gate will be turned off. Generally, a tri-state NOT gate needs to be connected to a high level signal and a low level signal to operate normally.

The structures of the above logic circuits are various and known, and thus detailed description thereof will be omitted herein.

The touch control driving unit according to the present invention has a reasonable structure, and thus has a small number of components, a simple structure, and a small area, which facilitates a narrow-frame design. In addition, the touch control driving unit can effectively eliminate adverse effects of control signals, reduce noise, and cause the output thereof to be stable.

DETAILED DESCRIPTION

In order to make those skilled in the art understand the technical solutions of the present invention better, the present invention will be further described below in detail with reference to the accompanying drawings and specific embodiments.

Figure 1:
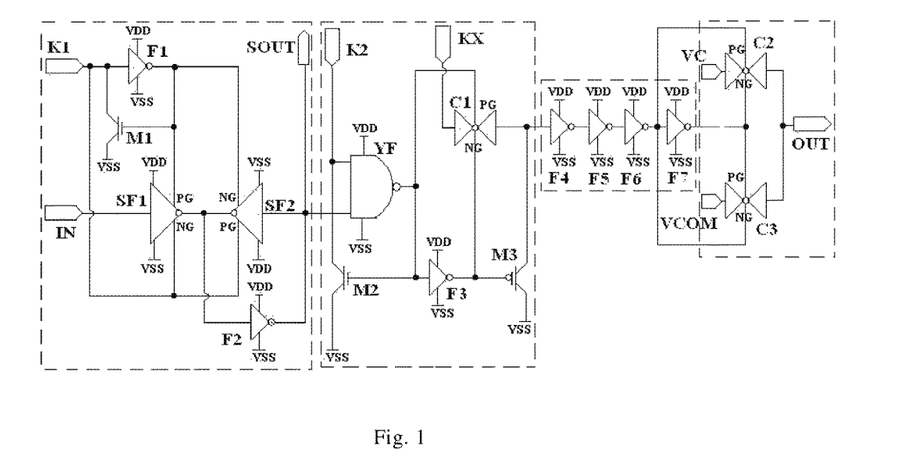
FIG. 1 is a circuit diagram illustrating a touch control driving unit according to an embodiment of the present invention.
Figure 2:
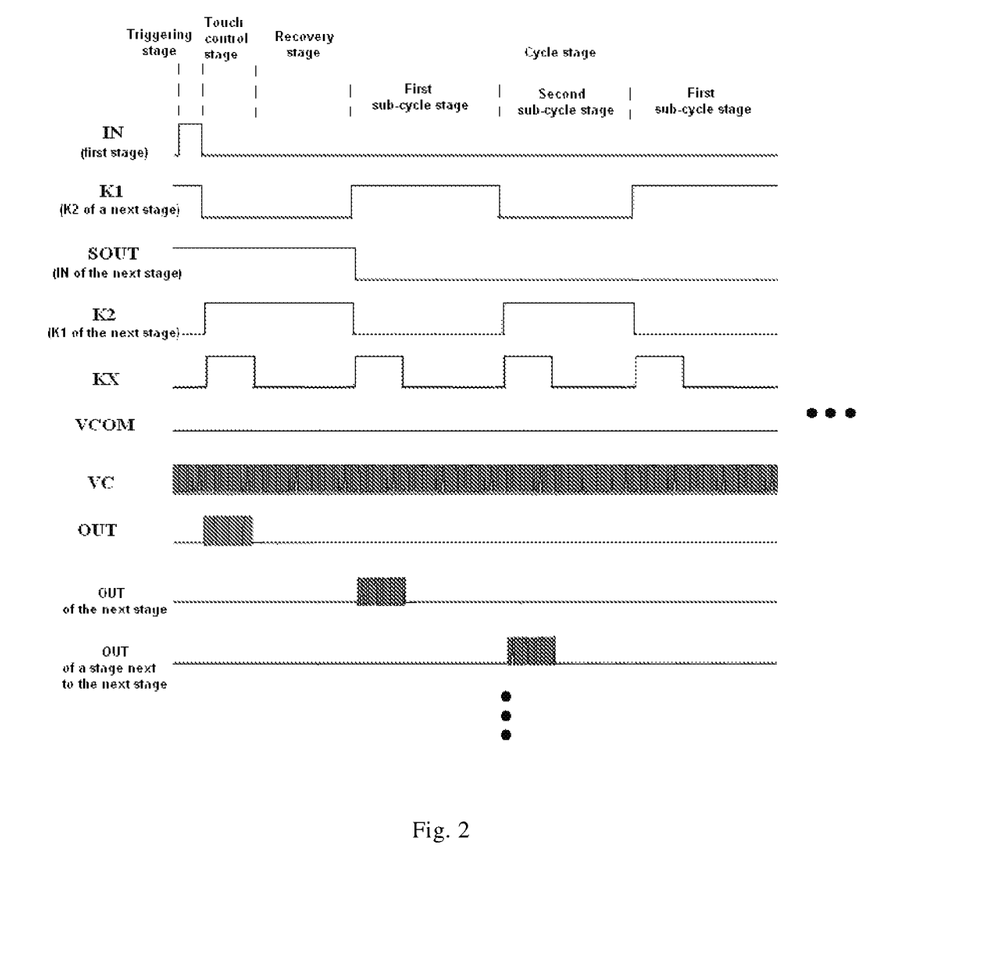
FIG. 2 is a timing diagram illustrating signals at ports of a touch control driving circuit according to an embodiment of the present invention.
Figure 3:
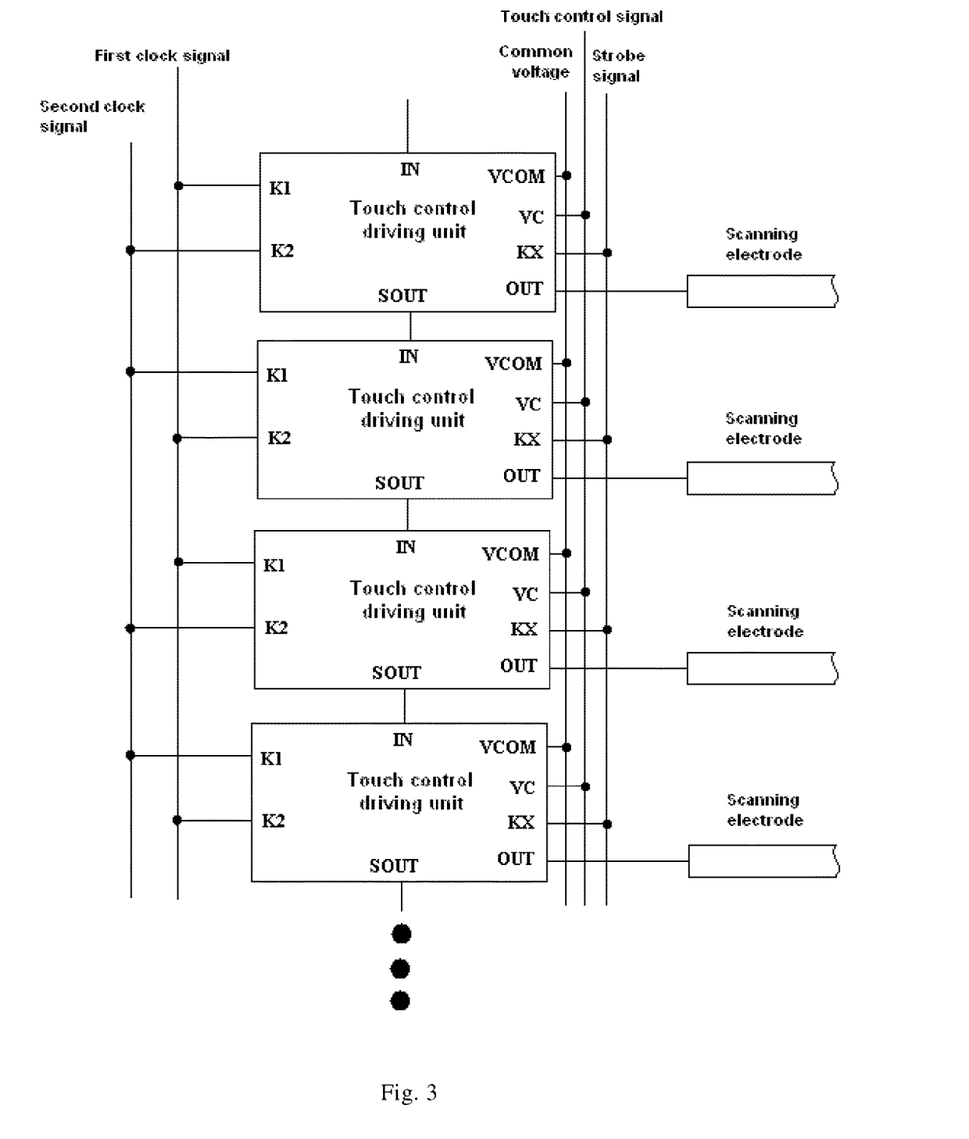
FIG. 3 is a block diagram illustrating a structure of a touch control driving circuit according to an embodiment of the present invention.

As shown in FIGS. 1 to 3, an embodiment of the present invention provides a touch control driving unit, which includes a shift register module, a strobe module and an output module.

The shift register module includes a first control port K1, an incoming port IN and a triggering signal outgoing port SOUT. The shift register module is connected to the strobe module, and is configured to generate a triggering signal.

The strobe module includes a second control port K2 and a strobe signal port KX. The strobe module is connected to the shift register module, and is configured to control the output module.

The output module includes an outgoing port OUT, a stable level port and a touch control signal port VC. The output module is configured to output a stable level or a touch control signal (which is generally a high frequency alternating signal) under control of the strobe module.

For example, the stable level port is a common voltage port VCOM. That is, the stable level port is connected to a common voltage, and thus a scanning electrode will be supplied with the common voltage when a touch control signal is not provided. Thus, a scanning electrode also serves as a common electrode. Hereinafter, description will be made by taking the fact that the stable level port is the common voltage port VCOM as an example.

Of course, it should be noted that, it is also feasible to supply another stable signal to the stable level port.

For example, the touch control driving unit may further include an amplifying module, which is provided between the shift register module and the output module, and is configured to amplify a signal generated by the strobe module and used for controlling the output module. In particular, the amplifying module may be provided between the strobe module and the output module, as shown in FIG. 1.

That is, the amplifying module may be further provided to amplify a control signal outputted from the shift register module, so that the reliability and stability of the touch control driving unit are increased. Of course, it should be noted that, the amplifying module may be omitted.

Specific preferred structures of the touch control driving unit will be described below with reference to FIG. 1.

For example, the shift register module may further include a first NOT gate F1, a second NOT gate F2, a first transistor M1, a first tri-state NOT gate SF1 and a second tri-state NOT gate SF2.

The first transistor M1 is an N-type transistor, a first electrode of the first transistor M1 is connected to the first control port K1, a second electrode of the first transistor M1 is connected to a low level signal VSS, and a gate electrode of the first transistor M1 is connected to an output terminal of the first NOT gate F1.

An input terminal of the first NOT gate F1 is connected to the first control port K1.

An input terminal of the first tri-state NOT gate SF1 is connected to the incoming port IN, a low level turn-on terminal PG of the first tri-state NOT gate SF1 is connected to the output terminal of the first NOT gate F1, a high level turn-on terminal NG of the first tri-state NOT gate SF1 is connected to the first control port K1, and an output terminal of the first tri-state NOT gate SF1 is connected to an input terminal of the second NOT gate F2 and an output terminal of the second tri-state NOT gate SF2.

An input terminal of the second tri-state NOT gate SF2 is connected to the triggering signal outgoing port SOUT, an output terminal of the second NOT gate F2 and the strobe module, a low level turn-on terminal PG of the second tri-state NOT gate SF2 is connected to the first control port K1, and a high level turn-on terminal NG of the second tri-state NOT gate SF2 is connected to the output terminal of the first NOT gate F1.

For example, the strobe module may further include a NAND gate YF, a second transistor M2, a third transistor M3, a third NOT gate F3 and a first transmission gate C1.

The second transistor M2 is an N-type transistor, a first electrode of the second transistor M2 is connected to the second control port K2, a second electrode of the second transistor M2 is connected to the low level signal VSS, and a gate electrode of the second transistor M2 is connected to an output terminal of the NAND gate YF, an input terminal of the third NOT gate F3 and a low level turn-on terminal PG of the first transmission gate C1.

A first input terminal of the NAND gate YF is connected to the second control port K2, a second input terminal of the NAND gate YF is connected to the input terminal of the second tri-state NOT gate SF2 of the shift register module.

An output terminal of the third NOT gate F3 is connected to a gate electrode of the third transistor M3 and a high level turn-on terminal NG of the first transmission gate C1.

The third transistor M3 is a P-type transistor, a first electrode of the third transistor M3 is connected to the amplifying module and an output terminal of the first transmission gate C1, and a second electrode of the third transistor M3 is connected to the low level signal VSS.

An input terminal of the first transmission gate C1 is connected to the strobe signal port KX.

For example, the amplifying module may include an even number of NOT gates connected in series. Among the even number of NOT gates connected in series, an output terminal of a previous stage NOT gate is connected to an input terminal of a next stage NOT gate adjacent to the previous stage NOT gate. For example, the number of NOT gates connected in series in the amplifying module is 4. That is, the NOT gates connected in series in the amplifying module may be a fourth NOT gate F4, a fifth NOT gate F5, a sixth NOT gate F6 and a seventh NOT gate F7, which is taken as an example to make the following description, but the present invention is not limited thereto.

An input terminal of the first NOT gate (e.g., the fourth NOT gate F4) is connected to the first electrode of the third transistor M3 of the strobe module.

Both an input terminal and an output terminal of the last NOT gate (e.g., the seventh NOT gate F7) are connected to the output module.

For example, the output module may further include a second transmission gate C2 and a third transmission gate C3.

An input terminal of the second transmission gate C2 is connected to the touch control signal port VC, an output terminal of the second transmission gate C2 is connected to the outgoing port OUT, a high level turn-on terminal NG of the second transmission gate C2 is connected to an output terminal of the last NOT gate (e.g., the seventh NOT gate F7) of the amplifying module, and a low level turn-on terminal PG of the second transmission gate C2 is connected to an input terminal of the last NOT gate of the amplifying module.

An input terminal of the third transmission gate C3 is connected to the common voltage port VCOM, an output terminal of the third transmission gate C3 is connected to the outgoing port OUT, a high level turn-on terminal NG of the third transmission gate C3 is connected to the input terminal of the last NOT gate (e.g., the seventh NOT gate F7) of the amplifying module, and a low level turn-on terminal PG of the third transmission gate C3 is connected to the output terminal of the last NOT gate of the amplifying module.

In FIG. 1, some logic circuits are further connected to the low level signal VSS and a high level signal VDD, which is a known method to cause the logic circuits to operate, thus detailed description thereof is omitted herein.

Another embodiment of the present invention provides a driving method of the touch control driving unit as described above. The driving method includes the following stages.

In a triggering stage, a triggering signal is outputted through the triggering signal outgoing port SOUT, and a common voltage is outputted to the outgoing port OUT.

In a touch control stage, a triggering signal is outputted through the triggering signal outgoing port SOUT, and a touch control signal is outputted to the outgoing port OUT.

In a recovery stage, a triggering signal is outputted through the triggering signal outgoing port SOUT, and a common voltage is outputted to the outgoing port OUT.

In a cycle stage, a low level is outputted through the triggering signal outgoing port SOUT, and a stable level is outputted to the outgoing port OUT continuously.

As shown in FIG. 2, the driving method and operational principle of the touch control driving unit will be further described below with reference to the specific structure of the touch control driving unit. The driving method specifically includes the following steps S01 to S04.

In the step S01 (i.e., the triggering stage), a high level is inputted to the incoming port IN, a high level is inputted to the first control port K1, a low level is inputted to the second control port K2, and a low level is inputted to the strobe signal port KX.

In the present stage, the high level inputted to the first control port K1 passes through the first NOT gate F1 and then becomes a low level, causing the first transistor M1 to be turned off. At the same time, the high level turn-on terminal NG of the first tri-state NOT gate SF1 is at the high level, and the low level turn-on terminal PG of the first tri-state NOT gate SF1 is at the low level, causing the first tri-state NOT gate SF1 to be turned on. Correspondingly, since the levels at the terminals of the second tri-state NOT gate SF2 are opposite to those at the corresponding terminals of the first tri-state NOT gate SF1, the second tri-state NOT gate SF2 is turned off definitely. In this case, the first tri-state NOT gate SF1 transforms the high level from the incoming port IN into a low level, which becomes a triggering signal with high level after passing through the second NOT gate F2. This triggering signal with high level is outputted from the triggering signal outgoing port SOUT, and inputted to the NAND gate YF through the second input terminal of the NAND gate YF.

Further, the low level from the second control port K2 is inputted to the other input terminal (i.e., the first input terminal) of the NAND gate YF, thus, the NAND gate YF outputs a high level, causing the second transistor M2 to be turned on. In this case, the low level signal VSS is transmitted to the first input terminal of the NAND gate YF through the second transistor M2, causing the input at the first input terminal of the NAND gate YF to be a stable low level. At the same time, the high level from the output terminal of the NAND gate YF passes through the third NOT gate F3 and then becomes a low level, which causes the first transmission gate C1 to be turned off and causes the third transistor M3 to be turned on. In this case, the low level signal VSS is transmitted to the output terminal of the first transmission gate C1 through the third transistor M3, and causes a signal at the output terminal of the first transmission gate C1 to be a stable low level.

The low level at the output terminal of the first transmission gate C1 is amplified by each of the NOT gates of the amplifying module, and then is inputted to the output module. As for the last NOT gate (e.g., the seventh NOT gate F7), the levels at the input terminal and at the output terminal thereof are opposite to each other definitely, thus, of the second transmission gate C2 and the third transmission gate C3, one must be turned on and the other must be tuned off. Here, the third transmission gate C3 is turned on, thus a common voltage at the common voltage port VCOM is outputted from the outgoing port OUT to a scanning electrode, causing the scanning electrode to display.

Thus, in the present stage, the low level at the first input terminal of the NAND gate YF is stable due to the effect of the second transistor M2, thus an adverse effect due to the fluctuation of a signal at the second control port K2 is avoided, thereby ensuring that the first transmission gate C1 is turned off. Further, a level at the output terminal of the first transmission gate C1 is pulled down to a low level stably due to the effect of the third transistor M3, thus the noise interference of a strobe signal is avoided, thereby enabling the touch control driving unit to output a common voltage stably.

In FIG. 2, the high level at the incoming port IN is very short in time, because this illustration is made by taking the first stage of touch control driving unit as shown in FIG. 3 as an example. A triggering signal, which is a signal from the incoming port IN, of the first stage of touch control driving unit may be specifically provided by a driving chip, and is preferred to be short in time. However, a triggering signal of each next stage of touch control driving unit is an output signal from the triggering signal outgoing port SOUT of an immediately previous stage of touch control driving unit, and the high level thereof is longer in time according to the description below. It should be noted that, the length in time of the high level does not affect the operation of a circuit herein.

In the step S02 (e.g., the touch control stage), a low level is inputted to the first control port K1, a high level is inputted to the second control port K2, and a high level is inputted to the strobe signal port KX.

In the present stage, a signal at the first control port K1 becomes a low level, which passes through the first NOT gate F1 and becomes a high level, causing the first transistor M1 to be turned on. Thus, the low level signal VSS is transmitted to the first control port K1 through the first transistor M1, and causes the low level at the first control port K1 to be more stable, thereby reducing the noise interference. At the same time, the two tri-state NOT gates have states opposite to those in the triggering stage, that is, the first tri-state NOT gate SF1 is turned off while the second tri-state NOT gate SF2 is turned on. Since the first tri-state NOT gate SF1 is turned off, a signal at the incoming port IN cannot enter the circuit, and will not affect the operation of the circuit, this is the reason why the length in time of the high level of a triggering signal does not affect the operation of a circuit herein. Further, without an input signal, the output terminal of the first tri-state NOT gate SF1 is at a low level, which passes through the second NOT gate F2 and becomes a high level. This high level passes through the second tri-state NOT gate SF2 and becomes the low level, causing the triggering signal outgoing port SOUT to output a stable triggering signal with high level, which is used for triggering a next stage of touch control driving unit. At the same time, this high level is also inputted to the input terminal (e.g., the second input terminal) of the NAND gate YF.

At this time, a signal at the other input terminal (e.g., the first input terminal, which is connected to the second control port K2) of the NAND gate YF is also a high level, thus the output of the NAND gate YF becomes a low level, which passes the third NOT gate F3 and becomes a high level, causing both the second transistor M2 and the third transistor M3 to be turned off. Further, the first transmission gate C1 is turned on, and a strobe signal from the strobe signal port KX is transmitted to the amplifying module.

At this time, the strobe signal is a high level, thus level states at respective nodes of the amplifying module and the output module are opposite to those in the triggering stage, respectively. The output module transmits a touch control signal at the touch control signal port VC to the outgoing port OUT, so as to input the touch control signal to a scanning electrode, thereby implementing touch control.

In the step S03 (i.e., the recovery stage), a low level is inputted to the first control port K1, a high level is inputted to the second control port K2, and a low level is inputted to the strobe signal port KX.

In the present stage, the signals at the ports other than the strobe signal port KX remain unchanged, and only the strobe signal changes to a low level. This low level is inputted to the amplifying module, thus the amplifying module and the output module have the same states as those in the triggering stage. As a result, the output module transmits the common voltage at the common voltage port VCOM to the outgoing port OUT, so that a scanning electrode maintains the common voltage for performing display.

In the step S04 (i.e., the cycle stage), a first sub-cycle stage and a second sub-cycle stage are performed alternately. In the first sub-cycle stage, a low level is inputted to the incoming port IN, a high level is inputted to the first control port K1, and a low level is inputted to the second control port K2. In the second sub-cycle stage, a low level is inputted to the first control port K1, and a high level is inputted to the second control port K2.

In the first sub-cycle stage, a signal at the first control port K1 becomes a high level again, causing the first tri-state NOT gate SF1 to be turned on. At this time, however, a signal at the incoming port IN is a low level, which passes through the first tri-state NOT gate SF1 and the second NOT gate F2, and then changes the signal at the triggering signal outgoing port SOUT to a low level. Thus, the triggering signal outgoing port SOUT does not output a triggering signal, but outputs the low level. Further, the other input signal, which is a signal from the second control port K2, of the NAND gate YF is also a low level, thus the output of the NAND gate YF is a high level. As a result, the first transmission gate C1 is turned off, thus a strobe signal will not have any effect on the subsequent modules no matter what the strobe signal will be. Furthermore, a low level is transmitted to the output terminal of the first transmission gate C1 through the third transistor M3, and is inputted to the amplifying module. As a result, the output module outputs a common voltage stably.

In the second sub-cycle stage, a signal at the first control port K1 becomes a low level again, causing the first tri-state NOT gate SF1 to be turned off and causing the second tri-state NOT gate SF2 to be turned on. At this time, the input terminal of the second tri-state NOT gate SF2 is at a low level, which passes through the loop of the second tri-state NOT gate SF2 and the second NOT gate F2 and causes the triggering signal outgoing port SOUT to keep an output of low level. In addition, the corresponding input terminal (e.g., the second input terminal) of the NAND gate YF is at a low level, thus the output of the NAND gate YF is a high level. In this case, the first transmission gate C1 is still turned off, and thus a strobe signal cannot enter therein. As a result, the output module continues to output a common voltage.

Thus, in the present stage, the output of the triggering signal outgoing port SOUT becomes a low level, that is, the triggering signal outgoing port SOUT does not output a triggering signal anymore. At the same time, regardless the changes of the signals at the first control portK1 and the second control port K2, a signal at the outgoing port OUT is always a common voltage, which may be used for continuous display.

Thus, the first and second sub-cycle stages occur alternately depending on the changes of the signals at the first control port K1 and the second control port K2. When a signal at the incoming port IN becomes a high level again, the touch control driving unit repeats the triggering stage to start a new cycle of operation.

As shown in FIG. 3, still another embodiment of the present invention provides a touch control driving circuit including a plurality of the above-described touch control driving units which are cascaded, in which an outgoing port OUT of each stage of touch control driving unit is connected to one scanning electrode, and a triggering signal outgoing port SOUT of a previous stage of touch control driving unit is connected to an incoming port IN of a next stage of touch control driving unit which is adjacent to said previous stage of touch control driving unit.

Of course, among the plurality of the touch control driving units which are cascaded, the incoming port IN of the first stage of touch control driving unit may be connected to a special initial triggering signal, or may be connected to the triggering signal outgoing port SOUT of the last stage of touch control driving unit, and the present invention is not limited specifically.

Among the plurality of the touch control driving units, for example, of any two adjacent touch control driving units, a first control port K1 of one touch control driving unit may be configured to receive a first clock signal, a second control port K2 of the one touch control driving unit may be configured to receive a second clock signal, a first control port K2 of the other touch control driving unit may be configured to receive the second clock signal, and a second control port K2 of the other touch control driving unit may be configured to receive the first clock signal.

It is apparent from the above connection configuration that, a triggering signal generated by each stage of touch control driving unit is used for triggering an immediately next stage of touch control driving unit. As shown in FIG. 2, the operation stage of an immediately next stage of touch control driving unit is later than that of the current stage of touch control driving unit by half cycle of a clock signal. Thus, the circuit can be controlled with fewer control signals by providing two clock signals with opposite level states, and connecting control ports of two adjacent stages of touch control driving unit to opposite clock signals, respectively. In this way, the number of the wires of the circuit is reduced.

It should be understood that the aforementioned embodiments are merely exemplary embodiments used for describing the principle of the present invention, but the present invention is not limited thereto. For a person of ordinary skill in the art, various variations and improvements may be made without departing from the spirit and essence of the present invention, and those variations and improvements also fall within the protection scope of the present invention.

The invention claimed is:

1. A touch control driving unit, comprising a shift register module, a strobe module and an output module, wherein
the shift register module comprises a first control port, an incoming port and a triggering signal outgoing port, the shift register module is connected to the strobe module and is configured to generate a triggering signal;
the strobe module comprises a second control port and a strobe signal port, the strobe module is connected to the shift register module and is configured to control the output module;
the output module comprises an outgoing port, a stable level port and a touch control signal port, the output module is configured to output a stable level or a touch control signal under control of the strobe module;
the shift register module further comprises a first NOT gate, a second NOT gate, a first transistor, a first tri-state NOT gate and a second tri-state NOT gate;
the first transistor is an N-type transistor, a first electrode of the first transistor is connected to the first control port, a second electrode of the first transistor is connected to a low level signal, and a gate electrode of the first transistor is connected to an output terminal of the first NOT gate;
an input terminal of the first NOT gate is connected to the first control port;
an input terminal of the first tri-state NOT gate is connected to the incoming port, a low level turn-on terminal of the first tri-state NOT gate is connected to the output terminal of the first NOT gate, a high level turn-on terminal of the first tri-state NOT gate is connected to the first control port, and an output terminal of the first tri-state NOT gate is connected to an input terminal of the second NOT gate and an output terminal of the second tri-state NOT gate; and
an input terminal of the second tri-state NOT gate is connected to the triggering signal outgoing port, an output terminal of the second NOT gate and the strobe module, a low level turn-on terminal of the second tri-state NOT gate is connected to the first control port, and a high level turn-on terminal of the second tri-state NOT gate is connected to the output terminal of the first NOT gate.

2. The touch control driving unit according to claim 1, further comprising:
an amplifying module provided between the strobe module and the output module, and configured to amplify a signal which is generated by the strobe module and is used for controlling the output module.

3. The touch control driving unit according to claim 1, wherein the strobe module further comprises a NAND gate, a second transistor, a third transistor, a third NOT gate and a first transmission gate, wherein
the second transistor is an N-type transistor, a first electrode of the second transistor is connected to the second control port, a second electrode of the second transistor is connected to the low level signal, and a gate electrode of the second transistor is connected to an output terminal of the NAND gate, an input terminal of the third NOT gate and a low level turn-on terminal of the first transmission gate;
a first input terminal of the NAND gate is connected to the second control port, a second input terminal of the NAND gate is connected to the input terminal of the second tri-state NOT gate of the shift register module;
an output terminal of the third NOT gate is connected to a gate electrode of the third transistor and a high level turn-on terminal of the first transmission gate;
the third transistor is a P-type transistor, a first electrode of the third transistor is connected to the amplifying module and an output terminal of the first transmission gate, and a second electrode of the third transistor is connected to the low level signal; and
an input terminal of the first transmission gate is connected to the strobe signal port.

4. The touch control driving unit according to claim 3, wherein the amplifying module comprises an even number of NOT gates connected in series, among the even number of NOT gates connected in series, an output terminal of a previous stage NOT gate is connected to an input terminal of a next stage NOT gate adjacent to the previous stage NOT gate, wherein
an input terminal of the first NOT gate of the even number of NOT gates connected in series is connected to the first electrode of the third transistor of the strobe module; and
both an input terminal and an output terminal of the last NOT gate of the even number of NOT gates connected in series are connected to the output module.

5. The touch control driving unit according to claim 4, wherein the number of NOT gates connected in series in the amplifying module is 4.

6. The touch control driving unit according to claim 4, wherein the output module further comprises a second transmission gate and a third transmission gate, wherein,
an input terminal of the second transmission gate is connected to the touch control signal port, an output terminal of the second transmission gate is connected to the outgoing port, a high level turn-on terminal of the second transmission gate is connected to an output terminal of the last NOT gate of the amplifying module, and a low level turn-on terminal of the second transmission gate is connected to an input terminal of the last NOT gate of the amplifying module; and
an input terminal of the third transmission gate is connected to the stable level port, an output terminal of the third transmission gate is connected to the outgoing port, a high level turn-on terminal of the third transmission gate is connected to the input terminal of the last NOT gate of the amplifying module, and a low level turn-on terminal of the third transmission gate is connected to the output terminal of the last NOT gate of the amplifying module.

7. The touch control driving unit according to claim 1, wherein the stable level port is a common voltage port.

8. A driving method of the touch control driving unit according to claim 1, comprising:
a triggering stage of outputting a triggering signal through the triggering signal outgoing port, and outputting a stable level to the outgoing port;
a touch control stage of outputting a triggering signal through the triggering signal outgoing port, and outputting a touch control signal to the outgoing port;

a recovery stage of outputting a triggering signal through the triggering signal outgoing port, and outputting a stable level to the outgoing port; and a cycle stage of outputting a low level through the triggering signal outgoing port, and outputting a stable level to the outgoing port continuously.

9. A driving method of the touch control driving unit according to claim 6, comprising:

a triggering stage of inputting a high level to the incoming port, inputting a high level to the first control port, inputting a low level to the second control port, and inputting a low level to the strobe signal port;

a touch control stage of inputting a low level to the first control port, inputting a high level to the second control port, and inputting a high level to the strobe signal port;

a recovery stage of inputting a low level to the first control port, inputting a high level to the second control port, and inputting a low level to the strobe signal port; and a cycle stage of performing a first sub-cycle stage and a second sub-cycle stage alternately, wherein, in the first sub-cycle stage, a low level is inputted to the incoming port, a high level is inputted to the first control port, and a low level is inputted to the second control port, and in the second sub-cycle stage, a low level is inputted to the first control port, and a high level is inputted to the second control port.

10. A touch control driving circuit, comprising a plurality of touch control driving units which are cascaded, each of the plurality of touch control driving units is the touch control driving unit according to claim 1, wherein an outgoing port of each stage of touch control driving unit is connected to one scanning electrode, and a triggering signal outgoing port of the stage of touch control driving unit is connected to an incoming port of a next stage of touch control driving unit which is adjacent to the stage of touch control driving unit.

11. A touch control driving circuit, comprising a plurality of touch control driving units which are cascaded, each of the plurality of touch control driving units is the touch control driving unit according to claim 6, wherein of any two adjacent touch control driving units, a first control port of one touch control driving unit is configured to receive a first clock signal, a second control port of the one touch control driving unit is configured to receive a second clock signal, a first control port of the other touch control driving unit is configured to receive the second clock signal, and a second control port of the other touch control driving unit is configured to receive the first clock signal.

12. The touch control driving circuit according to claim 11, wherein level states of the first and second clock signals are opposite to each other.

13. The touch control driving unit according to claim 2, wherein the stable level port is a common voltage port.

14. The touch control driving unit according to claim 3, wherein the stable level port is a common voltage port.

15. The touch control driving unit according to claim 4, wherein the stable level port is a common voltage port.

16. The touch control driving unit according to claim 5, wherein the stable level port is a common voltage port.

17. The touch control driving unit according to claim 6, wherein the stable level port is a common voltage port.

* * * * *